(12) United States Patent
Hirata et al.

(10) Patent No.: US 6,174,197 B1
(45) Date of Patent: Jan. 16, 2001

(54) CARD CONNECTOR ASSEMBLY

(75) Inventors: Hideyuki Hirata, Yokohama; Soichi Watanabe, Yokohoma, both of (JP)

(73) Assignee: Molex Incorporated, Lisle, IL (US)

( * ) Notice: Under 35 U.S.C. 154(b), the term of this patent shall be extended for 0 days.

(21) Appl. No.: 09/169,487

(22) Filed: Oct. 9, 1998

(30) Foreign Application Priority Data

Oct. 9, 1997 (JP) .................................................. 9-293316
Jul. 24, 1998 (JP) ................................................ 10-225478

(51) Int. Cl.[7] .......................... H01R 12/00; H01R 13/66; H01R 13/60; H05K 1/00
(52) U.S. Cl. ........................... 439/541.5; 439/79; 439/80; 439/64
(58) Field of Search .................................. 439/541.5, 79, 439/80, 64

(56) References Cited

U.S. PATENT DOCUMENTS

| | | | |
|---|---|---|---|
| 5,176,523 | 1/1993 | Lai | 439/64 |
| 5,286,207 | 2/1994 | McHugh | 439/64 |
| 5,316,488 | 5/1994 | Gardner et al. | 439/79 |
| 5,318,452 | 6/1994 | Brennian, Jr. et al. | 439/79 |
| 5,470,259 | 11/1995 | Kaufman et al. | 439/607 |
| 5,492,481 | 2/1996 | Lewis | 439/159 |
| 5,636,999 | 6/1997 | Hirai et al. | 439/79 |
| 5,688,130 | 11/1997 | Huang | 439/79 |
| 5,725,385 | 3/1998 | Takano et al. | 439/64 |
| 5,775,923 | 7/1998 | Tomioka | 439/79 |

*Primary Examiner*—Paula Bradley
*Assistant Examiner*—Edwin A. León
(74) *Attorney, Agent, or Firm*—Stacey E. Caldwell

(57) ABSTRACT

Disclosed is a card connector assembly comprising a shell assembly having upper and lower shells for accommodating a memory device in the form of a card, and a pin connector assembly including an insulating housing having signal pins mounted therein with connection pins adapted to be received in the memory device inserted in the associated shell. The pin connector assembly is a unitary molded housing having an upper and lower rows of signal terminals adapted to be soldered directly to a printed circuit board in a single soldering step. The shell assembly is adapted to be assembled to the pin connector assembly by way of interengaging slots and corresponding shell parts.

2 Claims, 6 Drawing Sheets

CARD CONNECTOR ASSEMBLY

FIELD OF THE INVENTION

The present invention relates to an improved card connector assembly for making an electrical connection between a memory device in the form of a card, such as a communication card, memory card or hard disk drive (HDD) package, and a printed circuit board.

BACKGROUND OF THE INVENTION

Card connector assemblies have been widely used in personal computers, lap-top computers, notebook type computers and the like. A card connector assembly typically comprises a shell assembly for accommodating memory devices in the form of a card, and a pin connector assembly. The shell assembly is often a double-deck structure to accommodate two cards, comprising upper and lower shell compartments to enclose at least a portion of each of the cards, and each shell compartment may be equipped with an ejection mechanism. The connection pins of the pin connector assembly are adapted to be received in receptacles of the memory devices inserted in the shell compartments (see, e.g., Patent Application Laid-Open Nos. 6-332573 and 7-302645).

There are a variety of ways in which a card connector assembly has been mounted in a computer. One such way is where a relay connector is fixed on a printed circuit board of the computer and a card connector assembly is also fixed on the circuit board and the card connector assembly is connected to the relay connector by a flat flexible cable. Another way is where a relay substrate is integrally connected to a pin connector assembly of a card connector assembly and a relay connector is fixed on a printed circuit board of a computer. The card connector assembly is connected to the relay connector through the relay substrate. Still another way is where a pin connector assembly is configured on a rear end thereof to mate with a relay connector which is mounted on a printed circuit board of the computer, and then the card connector assembly is connected to the relay connector by mating the pin connector assembly to the relay connector. Also, a relay plate may be integrally connected to a pin connector assembly of a card connector assembly, and one part of a relay connector may be fixed to the relay plate. The mating part of the relay connector is then fixed to a printed circuit board of the computer, and the card connector assembly is then mounted in the computer by mating the two parts of the relay connector.

Use of a relay connector improves the efficiency and workability of equipping a computer with a card connector assembly, but extra parts such as relay connectors, flat flexible cables, relay plates and the like contribute to higher assembly and component costs of the card connector assembly.

SUMMARY OF THE INVENTION

One object of the present invention is to provide such a card connector assembly that requires the least amount of components and assembly steps in mounting it on the printed circuit board of a computer.

To obtain these objects, a card connector assembly is improved according to the present invention in that it comprises: a shell assembly for accommodating one or more memory devices in the form of a card, comprising an upper and lower shell that together encloses at least a portion of each memory device; and a pin connector assembly including a single, unitarily molded insulating housing and upper and lower rows of signal terminals mounted therein, wherein each signal terminal includes a connection pin adapted to be received in a memory device inserted in the associated shell and a solder tail adapted to be soldered directly to the printed circuit board. The solder tails of the upper rows of signal terminals extend generally below and parallel to the connection pins of the upper rows and are adapted to contact the surface of the printed circuit board in a single coplanar linear array proximate the rear of the insulating housing. The solder tails of the lower rows of signal terminals extend generally below and parallel to the connection pins of the lower rows and are adapted to contact the surface of the printed circuit board in a single coplanar linear array proximate the front of the insulating housing. All of the solder tails are adapted to be simultaneously soldered to the circuit board in a single soldering step.

The shell assembly is adapted to be assembled to said pin connector assembly after the pin connector assembly is soldered to the printed circuit board.

The pin connector assembly includes a detachable tail aligning device applied to the insulating housing to maintain the position of the solder tails of the lower rows terminals.

The insulating housing includes two side arms extending forward on opposite sides thereof. The side arms are used as guide means to assemble the shell assembly to the pin connector assembly. Each side arm includes upper and lower longitudinal guide slots to guide upper and lower engagement nails integrally formed on the upper and lower shells. The upper and lower longitudinal guide slots include engagement projections formed therein to prevent the engagement nails from being pulled out of the longitudinal guide slots. The interengagement between the slots and the engagement nails ensures a secure assembly between the shell and pin connector assemblies. Furthermore, the single solder tail arrays and simultaneous soldering of all of the solder tails of the signal terminals makes fixing the pin connector assembly to the printed circuit board relatively simple and quick.

The insulating housing further includes upper and lower receiving slots in each side arm extending rearwardly from the front of the insulating housing. Each of the upper and lower shells includes an engagement piece integrally formed at an end thereof, thereby permitting the assembly of the shell assembly to the pin connector assembly by inserting the engagement pieces of the upper and lower shells into the upper and lower receiving slots of the insulating housing.

Other objects and advantages of the present invention will be understood from the following description of a card connector assembly according to the present invention, which is shown in the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
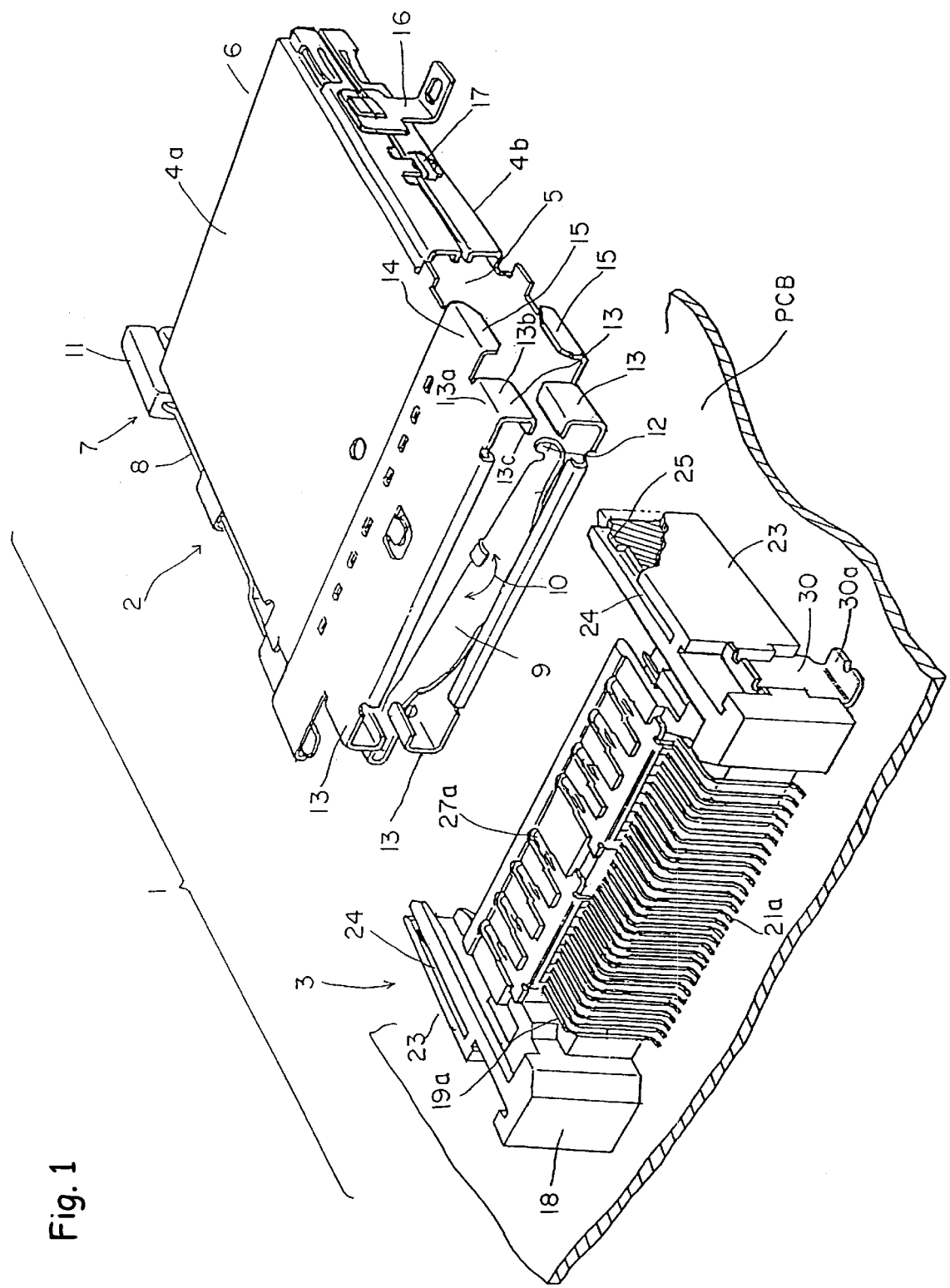
FIG. 1 is a perspective view of a card connector assembly according to the present invention.

Referring to the drawings, and first to FIG. 1, a card connector assembly 1 for connecting a memory device to a printed circuit board according to the present invention comprises a shell assembly 2 for accommodating memory devices in the form of memory or PC cards, and a pin connector assembly 3 including a pin connector housing 18 and signal terminals 19a and 19b mounted therein. The signal terminals of the pin connector assembly are adapted to be received in receptacles of one or more memory devices inserted in the shell assembly. Pin connector assembly 3 is adapted to be fixed to a printed circuit board and shell assembly 2 is adapted to be fixed to pin connector assembly 3 as described in more detail below.

Figure 2:
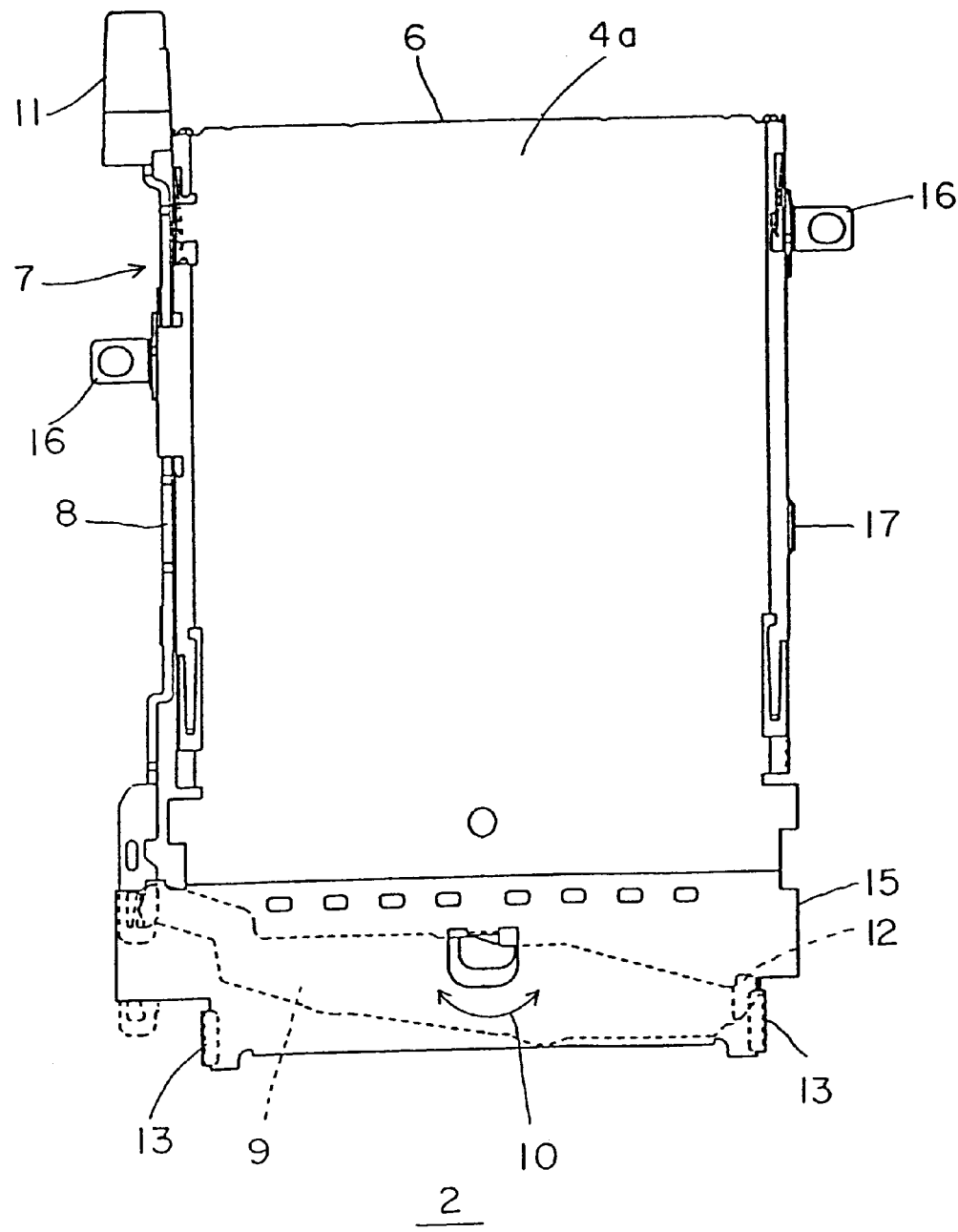
FIG. 2 is a plan view of the shell assembly of the card connector assembly.

As seen in FIGS. 1 and 2, shell assembly 2 comprises upper and lower shells 4a and 4b combined in a double-deck configuration to accommodate a memory device in the form of two memory cards or a single HDD package, for example. Each shell is rectangularly-shaped to define a card-containing space which accommodates and encloses at least a portion of the memory device inserted in the shell. The shells 4a and 4b are open on the front side (the top side in FIG. 2) to define a card-insertion inlet 6.

Each shell can include a card-ejection mechanism 7 composed of an ejection rod 8 and an ejection lever 9. Ejection rod 8 is slidably movable along one longitudinal side of the shell and ejection lever 9 is pivotably attached at the rear side of the shell. The rear distal end of ejection rod 8 is connected to one end of ejection lever 9. When the ejection rod is moved rearwardly by pushing an actuator button 11, the ejection lever pivots, as indicated by arrow 10, and contacts the card with an ejection end 12 of lever 9, thereby ejecting the card out of card-insertion inlet 6. The shell assembly is fabricated substantially entirely of stamped and formed conductive sheet metal material, however the actuator button may be fabricated of a dielectric molded plastic material.

As shown most clearly in FIG. 1, upper shell 4a has catch pieces 13 formed on opposite sides of the rear of the shell. Each catch piece 13 is composed of a first horizontal section 13a, a vertical section 13b and a second horizontal section 13c. Vertical section 13b is formed by bending a cut of an upper portion of the shell at a right angle to first horizontal section 13a, and the second horizontal section 13c is formed by bending back the cut at a right angle to vertical section 13b. As seen in FIG. 1, a lateral horizontal extension 14 extends laterally beyond one catch piece 13. The lateral horizontal extension 14 has a catch nail 15 extending downwardly from an end. Similarly, the rear of lower shell 4b has a shape symmetrical to the rear of upper shell 4a, having catch pieces 13 formed at opposite sides thereof. A lateral horizontal extension 14 extends laterally beyond one catch piece 13, having a catch nail 15 extending upwardly from its end, thus confronting catch nail 15 of upper shell 4a. Upper and lower shells 4a and 4b are attached on their longitudinal sides by leg pieces 16 and interengaging fasteners 17.

Referring now to FIGS. 3 through 9, pin connector assembly 3 comprises an insulating housing 18 and a plurality of signal terminals 19 fixed therein. The insulating housing is a single, unitarily molded dielectric housing that mounts upper and lower rows of signal terminals 19a and 19b. Each signal terminal 19a and 19b includes a connection pin 20a and 20b and a solder tail 21a and 21b, respectively. As shown most clearly in FIG. 8, each signal terminal in the upper rows has a connection pin 20a at one end and a solder tail 21a at the other end, wherein the solder tail extends below connection pin 20a, generally parallel to and away from connection pin 20a. Likewise, each signal terminal in the lower rows of signal terminals has a connection pin 20b at one end and a solder tail 21b at the other end, wherein the solder tail extends below connection pin 20b, generally parallel to and toward connection pin 20b. The upper and lower rows of signal terminals are arranged to correspond to the upper and lower shells of the shell assembly, with both sets of connection pins 20a and 20b extending toward the front of insulating housing 18, and solder tails 21a of the upper rows of signal terminals extending toward the rear of insulating housing 18 and solder tails 21b of the lower rows of signal terminals extending toward the front of insulating housing 18.

Solder tails 21a and 21b of all of the signal terminals 19a and 19b are coplanar with respect to an underlying printed circuit board (not shown), and all of the solder tails 21a in the upper rows of signal terminals extends in a single, coplanar linear array and all of the solder tails 21b of the lower rows of signal terminals extends in a single, coplanar linear array, thereby permitting the simultaneous soldering of all of the solder tails to corresponding conductors of the printed circuit board.

A tail aligning device 22 is applied to insulating housing 18 to maintain the position of solder tails 21b of the lower rows of signal terminals during soldering. The alignment device 22 is a comb-like plate, and is slidably attached to insulating housing 18 along forwardly extending side arms 23. Therefore the aligning device is slidable back and forth along side arms 23. After soldering solder tails 21 of signal terminals 19 to the printed circuit board, alignment device 22 may be moved away from the solder tails or removed altogether.

Opposite side arms 23 are used as guide means during the assembly of shell assembly 2 to pin connector assembly 3. Specifically, each side arm 23 has upper and lower longitudinal guide slots 24 (FIGS. 3 and 4) to guide upper and lower engagement nails 15 of upper and lower shells 4a and 4b into engagement with pin connector assembly 3. Upper and lower longitudinal guide slots 24 have engagement projections 25 (FIG. 7) formed therein to prevent the engagement nails from being pulled out of longitudinal guide slots 24 once inserted. When engagement nails 15 are inserted into guide slots 24, engagement nails 15 ride over engagement ramps 25, and are therefore prevented from moving back toward the front of the housing. The engagement nails are formed on one side of shell assembly 2 (FIG. 1), and are retained by ramp projections 25 in upper and lower guide slots 24 of one side arm 23 of pin connector assembly 3. Guide slots 24 of the other side arm 23 confronting the side of shell assembly 2 on which it has the ejection rod 8 are not used in guiding engagement nails 15.

However since the pin connector assembly is equipped on both sides of the housing with the guide slots, the shell assembly may be oriented and assembled onto the pin connector assembly with the ejection mechanism on either side.

Figure 4:
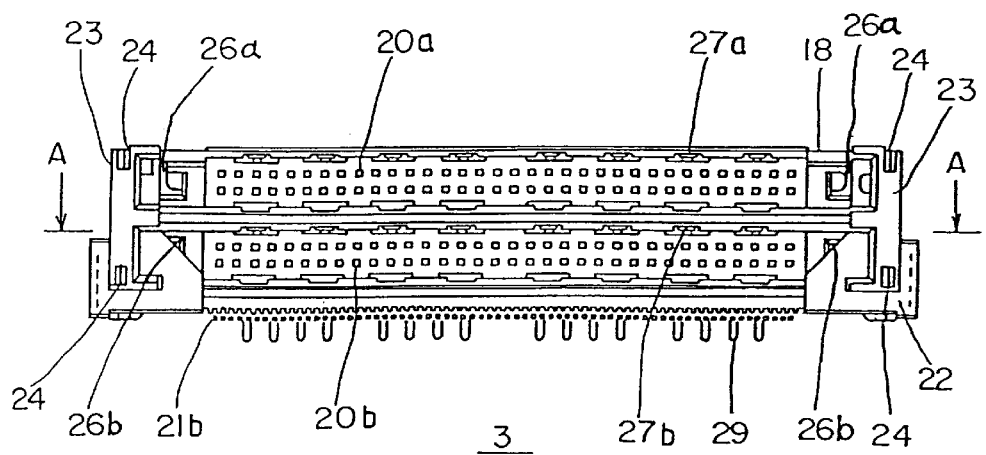
FIG. 4 is a front view of the pin connector assembly.
Figure 5:
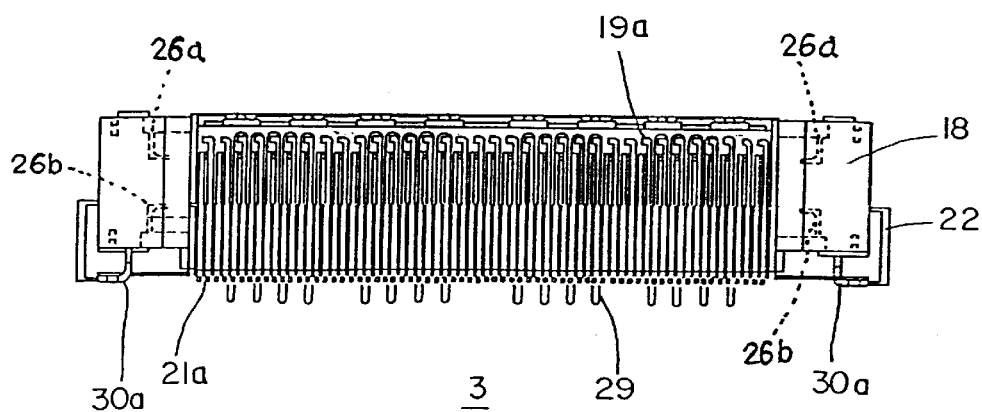
FIG. 5 is a rear view of the pin connector assembly.
Figure 6:
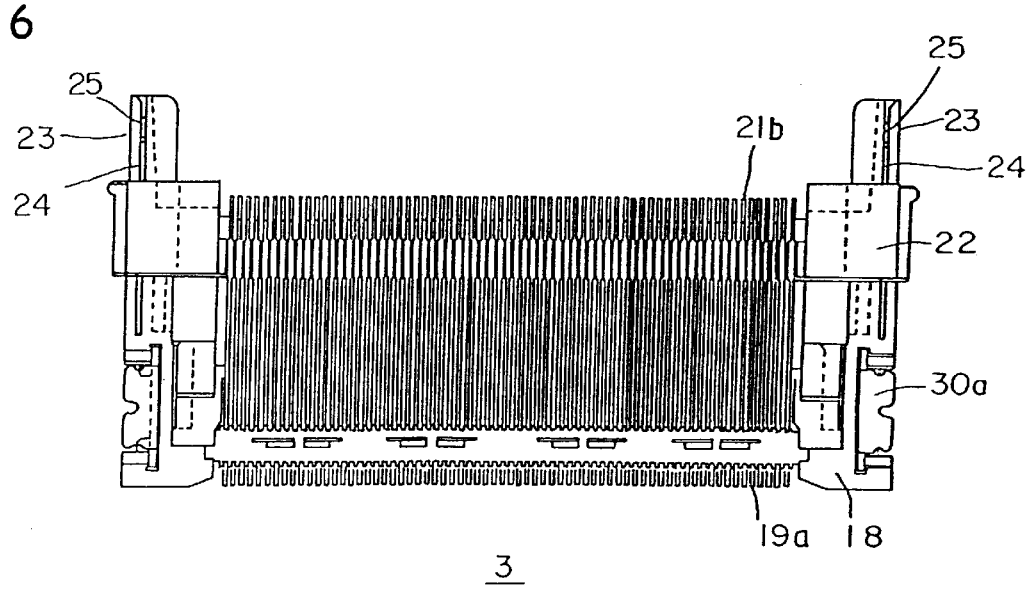
FIG. 6 is a bottom view of the pin connector assembly.
Figure 7:
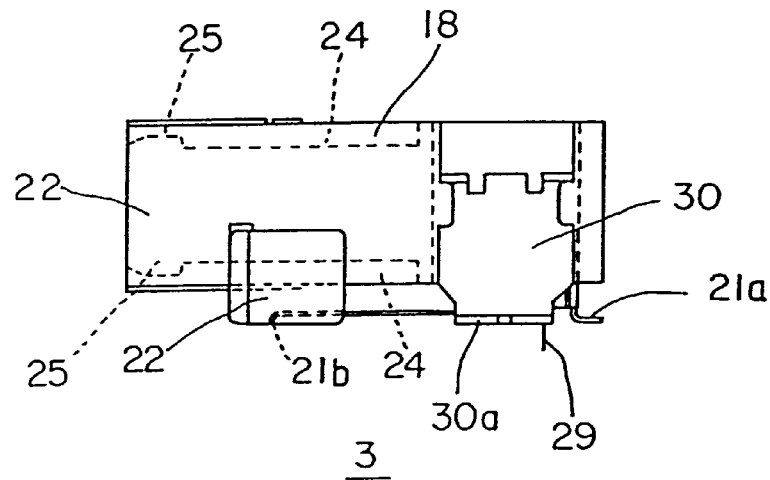
FIG. 7 is a side view of the pin connector assembly.

Looking to FIGS. 4 and 5, insulating housing 18 has upper and lower "L"-shaped receiving slots 26a and 26b extending rearwardly from the front of the housing for receiving catch pieces 13 of upper and lower shells 4a and 4b of shell assembly 2. When engagement nails 15 reach the ends of upper and lower guide slots 24, catch pieces 13 are also received in receiving slots 26.

Figure 3:
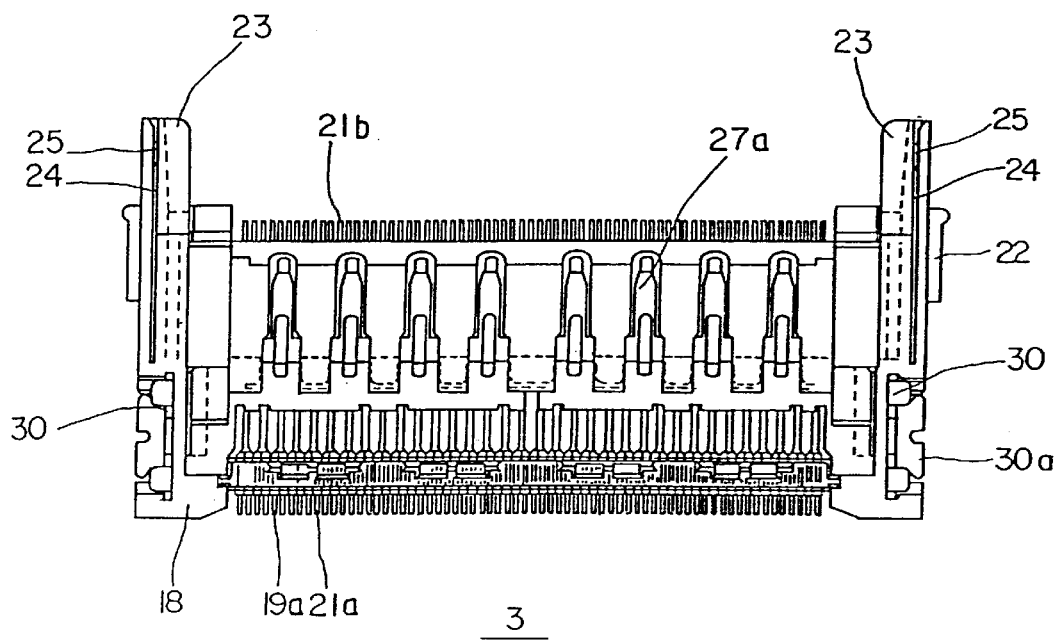
FIG. 3 is a plan view of the pin connector assembly of the card connector assembly.
Figure 8:
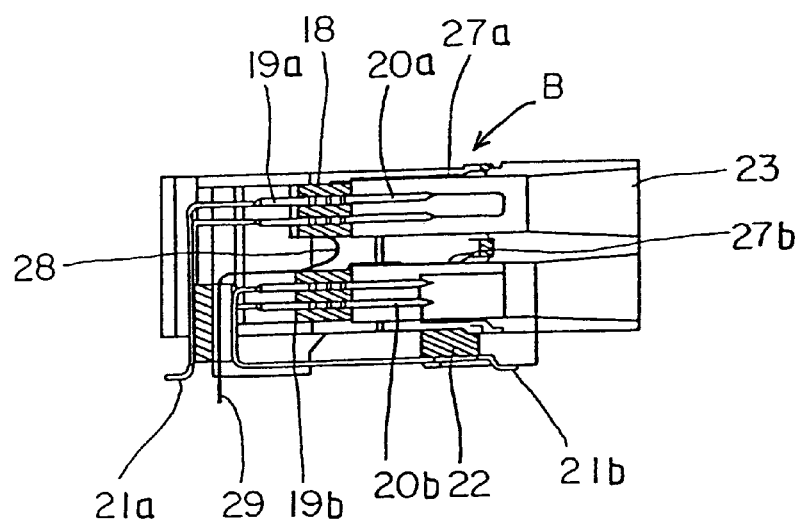
FIG. 8 is a longitudinal section of the pin-terminal assembly.
Figure 9:
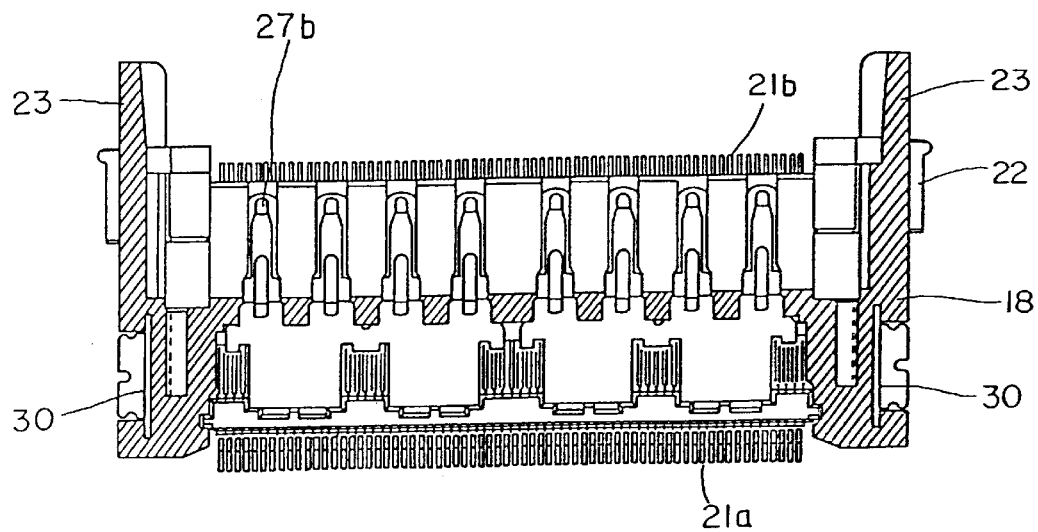
FIG. 9 is a sectional side view of the pin connector assembly taken along line A—A in FIG. 4.

Looking at FIG. 3 in conjunction with FIGS. 8 and 9, pin connector assembly 3 also includes upper and lower grounding terminals 27a and 27b arranged above upper and lower rows of connection pins 20a and 20b, respectively. These grounding terminals 27a and 27b are adapted to contact and electrically ground the conductive shells of the memory devices to the ground circuit of the printed circuit board. As seen in FIG. 8, upper and lower grounding terminals 27a and 27b are connected by connecting pieces 28, and the downwardly extending solder tails 29 of lower grounding terminals 27b can be soldered to the printed circuit board simultaneously with solder tails 21a and 21b of signal terminals 19a and 19b.

Insulating housing 18 also includes L-shaped metal legs 30 attached to opposite sides thereof, and horizontal feet 30a of the L-shaped metal legs can be soldered to the printed circuit board at the same time solder tails 29 and 21a and 21b are soldered.

Figure 10:
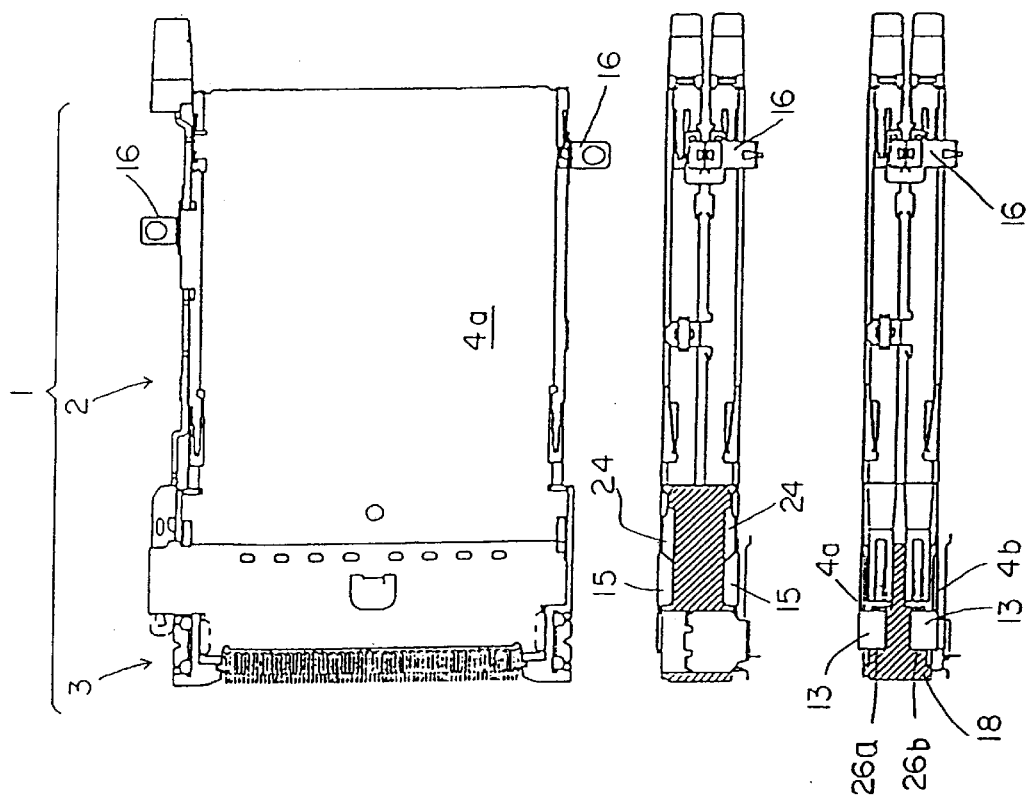
FIG. 10 shows plan and sectional views of the card assembly with the pin connector assembly and shell assembly assembled together.

As seen in FIG. 10, the connector assembly in its assembled state comprises shell assembly 2 assembled to pin connector assembly 3 wherein engagement nails 15 are at the ends of guide slots 24. Catch pieces 13 of shell assembly 2 are received in slots 26a and 26b of pin connector assembly 3 with upper and lower shells 4a and 4b embracing insulating housing 18. Thus, shell assembly 2 and pin connector assembly 3 are firmly fixed together to provide a card connector assembly. The card connector assembly is positively fixed to the printed circuit board by soldering pin connector assembly 3 to the printed circuit board and by fastening legs 16 of the shell assembly, which effectively prevents shell assembly 2 from unwanted and unnecessary movement.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A card connector assembly for connecting a memory device to a printed circuit board comprising:

a shell assembly for accommodating the memory device including upper and lower shells which enclose a substantial portion of the memory device; and a pin connector assembly including
      a unitarily molded insulating housing mounting a plurality of signal terminals arranged in upper and lower rows, each signal terminal including a connection pin adapted to be received in the memory device and a solder tail adapted to be soldered to the printed circuit board, wherein the solder tails of the signal terminals in the upper rows extend generally below and parallel to the connection pins of the upper rows and are adapted to contact a surface of the printed circuit board in a single coplanar linear array proximate a rear of the insulating housing, and the solder tails of the signal terminals in the lower rows extend generally below and parallel to the connection pins of the lower rows and are adapted to contact the surface of the printed circuit board in a single coplanar linear array proximate a front of the insulating housing, whereby all of the solder tails are adapted to be simultaneously soldered to the circuit board in a single soldering step, wherein said shell assembly is adapted to be assembled to said pin connector assembly after said solder tails are soldered to the printed circuit board and wherein the upper and lower shells include upper and lower engagement nails on at least one side thereof and the insulating housing includes side arms having longitudinal guide slots which receive the engagement nails and guide the shell assembly into engagement with the pin connector assembly, wherein each longitudinal guide slot includes a detent formed therein to prevent the engagement nail from being easily removed from the guide slot.

2. A card connector assembly according to claim 1 wherein the solder tails of the lower rows of signal terminals are maintained in position by a tail aligning device slidably and removably attached to the insulating housing.

* * * * *